(12) United States Patent
Livezey

(10) Patent No.: US 11,430,533 B2
(45) Date of Patent: Aug. 30, 2022

(54) SAMPLE-AND-HOLD CIRCUIT ARRANGED FOR SETTING AN ADAPTABLE TIME DELAY

(71) Applicant: Melexis Technologies NV, Tessenderlo (BE)

(72) Inventor: Darrell Livezey, Brookline, NH (US)

(73) Assignee: MELEXIS TECHNOLOGIES NV, Tessenderlo (BE)

(*) Notice: Subject to any disclaimer, the term of this patent is extended or adjusted under 35 U.S.C. 154(b) by 594 days.

(21) Appl. No.: 16/048,691

(22) Filed: Jul. 30, 2018

(65) Prior Publication Data
US 2019/0043599 A1 Feb. 7, 2019

(30) Foreign Application Priority Data

Aug. 3, 2017 (EP) ..................................... 17184770

(51) Int. Cl.
| | | |
|---|---|---|
| G11C 27/00 | (2006.01) | |
| G11C 27/02 | (2006.01) | |
| G01S 7/4863 | (2020.01) | |
| G01S 7/4861 | (2020.01) | |
| G01S 17/10 | (2020.01) | |

(52) U.S. Cl.
CPC .......... *G11C 27/024* (2013.01); *G01S 7/4861* (2013.01); *G01S 7/4863* (2013.01); *G01S 17/10* (2013.01)

(58) Field of Classification Search
CPC ... G11C 27/024; H03M 1/126; H03M 1/1245; H03M 1/124; G01S 17/10; G01S 17/14; G01S 17/18; G01S 7/4861
See application file for complete search history.

(56) References Cited

U.S. PATENT DOCUMENTS

| | | | | |
|---|---|---|---|---|
| 5,179,286 A * | 1/1993 | Akasu | .................... | G01S 17/10 |
| | | | | 250/559.38 |
| 6,452,666 B1 * | 9/2002 | Barna | ...................... | G01C 3/08 |
| | | | | 356/5.01 |
| 7,206,062 B2 * | 4/2007 | Asbrock | ................. | G01S 7/483 |
| | | | | 356/4.01 |
| 7,388,535 B1 * | 6/2008 | Sitch | ...................... | H03M 1/12 |
| | | | | 341/155 |
| 7,834,665 B2 * | 11/2010 | Setterberg | ............. | G11C 27/02 |
| | | | | 327/94 |
| 9,191,582 B1 * | 11/2015 | Wright | .................... | G01S 7/495 |
| 9,219,490 B1 * | 12/2015 | Pereira | .................. | H03M 1/007 |
| 9,362,940 B2 * | 6/2016 | Mulder | ................ | G11C 27/026 |
| 9,684,066 B2 * | 6/2017 | Bartolome | ............. | G01S 17/10 |

(Continued)

OTHER PUBLICATIONS

Extended European Search Report from EP Application No. EP 17184770.0, dated Feb. 12, 2018.

*Primary Examiner* — Hovhannes Baghdasaryan
(74) *Attorney, Agent, or Firm* — Workman Nydegger

(57) ABSTRACT

A sample-and-hold circuit is provided that includes a plurality of sample-and-hold branches arranged in parallel and each including a buffer and a sample-and-hold block including one or more sample-and-hold cells. The sample-and-hold circuit further includes a clock and timing circuit arranged for setting an adaptable time delay to enable sampling and sampling phase for each sample-and-hold block. The time delay of at least one sample-and-hold block can be set to value bigger than one sampling clock period.

14 Claims, 6 Drawing Sheets

(56) References Cited

U.S. PATENT DOCUMENTS

| | | | |
|---|---|---|---|
| 10,690,448 B2 * | 6/2020 | Titus | G01S 7/487 |
| 2002/0105339 A1 * | 8/2002 | Nagaraj | H03M 1/1009 |
| | | | 324/601 |
| 2008/0100822 A1 * | 5/2008 | Munro | G01C 3/06 |
| | | | 356/4.01 |

* cited by examiner

SAMPLE-AND-HOLD CIRCUIT ARRANGED FOR SETTING AN ADAPTABLE TIME DELAY

FIELD OF THE INVENTION

The present invention is generally related to the field of sample-and-hold circuits More in particular the invention relates to a sample-and-hold circuit for use in a light detection and ranging systems.

BACKGROUND OF THE INVENTION

LIDAR (derived from 'light radar') systems are well known in the art. The term LIDAR system is used as an acronym of light detection and ranging system. Such systems are designed to perform a distance measurement to a target object by directing an incident light beam to that target and detecting the reflected light beam. The distance to the target may be calculated based on a time of flight measurement of the incident light beam and the reflected light beam. LIDAR systems can be used in a variety of adaptive driver assistance (ADAS) applications like emergency breaking, adaptive cruise control, blind spot monitoring; LIDAR systems can be one of the key sensing components in autonomous driving systems to aid vehicle navigation. It is to be noted, however, that also applications like distance measurement instrumentation, 3D mapping, virtual reality, augmented reality, robotics, automation, security surveillance make use of LIDAR systems.

LIDAR can in principal use any light wavelength, for example ultraviolet, visible, near-infrared or infrared light to image objects. The wavelengths used vary depending on the application specifications and the availability of (low-cost) optical components like light sources and photodetectors. The sensor records the light amplitude beginning from the time when the pulse is emitted and the amplitude versus time signal is used to find the reflected pulse shapes located in the scene.

LIDAR systems have been proposed in the art. The signals from the photodiode(s) are received in an analog front end block where they are converted into signals which can be processed for eventually determining the distance to the target object. A typical example of the analog front end block is a transimpedance amplifier converting photodiode electrical current signal into a voltage signal.

FIG. 1 shows a LIDAR system 200 comprising an array of photodiodes 202 and a block 201 wherein signals are received from the array of photodiodes and processed. An illumination source 207 emits light pulses or modulated light into the scene that in the example of FIG. 1 comprises a high reflective object 204 and a low reflective object 206. In the shown example the scene is projected on the photosensitive elements 202 in the LIDAR system via a lens 203. The received signals are then converted and processed in block 201. This typically comprises an amplification, analog-to-digital conversion, low-pass filtering and pulse detection (e.g. by applying curve fitting or correlation). Eventually the distance is determined by multiplying half the round trip time with the speed of light.

In order to achieve good accuracy in distance measurements LIDAR systems require a high sample rate. Prior art systems achieve this high sample rate by interleaving low sample rate data or using very high speed ADCs. Using interleaved data significantly reduces the frame rate and using high speed ADC's significantly increases the system cost and complexity. Indeed, existing systems use a non-configurable sample and hold array and collect multiple data sets with slight time offsets. These data sets are assembled by interleaving the data to create a complete data set with a high effective sample rate. This approach, however, requires taking a number of samples N to increase the effective sample rate by a factor of N, which causes the frame rate to be reduced by a factor of N.

U.S. Pat. No. 7,206,062 discloses a laser detection and ranging system including circuitry for generating the electrical signal with an optical signal detector using N discrete samples; a bank of M parallel sample/hold circuit unit cells individual ones of which operate with an associated sample/hold clock, where each sample/hold clock is shifted in time by a small fixed or programmable amount $\Delta t$ relative to a sample/hold clock of an adjacent sample/hold circuit unit cell. Hence, the amount $\Delta t$ is smaller than a clock period. The system further includes circuitry for sequentially coupling a sampled value of the electrical signal from a first output of individual ones of at least some of the M parallel sample/hold circuit unit cells to an analog to digital converter circuit (ADC).

In U.S. Pat. No. 5,179,286 a distance measuring apparatus is disclosed for measuring a distance to an object. The apparatus comprises a photodetection circuit for detecting a reflected pulse, which is next A/D converted. A processing unit processes the data to thereby arithmetically determine the distance to the object.

Data collection is typically performed as follows:
1. After the first light pulse is launched at time $T_{L1}$, the amplitude of the reflected signal is sampled and stored at times: $T_{L1}+n*SP$, where SP=sample period, and n=0, 1, 2 ... $N_{full}$, whereby $N_{full}$ represents the total number of sample-and-hold cells.
2. After the second light pulse is launched at time $T_{L2}>T_{L1}$, the amplitude of the reflected signal is sampled and stored at times: $T_{L2}+1*SP/4+n*SP$
3. After the third light pulse is launched at time $T_{L3}>T_{L2}$, the amplitude of the reflected signal is sampled and stored at times: $T_{L3}+2*SP/4+n*SP$
4. After the fourth light pulse is launched at time $T_{L4}>T_{L3}$, the amplitude of the reflected signal is sampled and stored at times: $T_{L4}+3*SP/4+n*SP$
5. Steps 1-4 may each be repeated a number of times to improve the SNR by performing an averaging.
6. The data collected can now be combined to create a data set equivalent to a signal sampled at times $T0+n*SP/4$; n=0, 1, 2, ... $4*N_{full}$, where T0 is typically set equal to $T_{L1}$
7. Note that $N_{full}$, the number of samples stored for each sampling run, is large enough to capture reflected pulses over the full distance range of the detector.

This approach requires several sample runs to collect the data necessary to obtain sufficient accuracy in the distance measurements.

Hence, there is a need for improved schemes wherein these drawbacks are avoided or overcome.

SUMMARY OF THE INVENTION

It is an object of embodiments of the present invention to provide for a configurable sample-and-hold circuit.

The above objective is accomplished by the solution according to the present invention.

In a first aspect the invention relates to a sample-and-hold circuit comprising a plurality of sample-and-hold branches arranged in parallel and each comprising a buffer and a sample-and-hold block comprising one or more sample-andhold cells. The sample-and-hold circuit further comprises a clock and timing circuit arranged for setting an adaptable time delay to enable sampling and sampling phase for each sample-and-hold block, whereby the time delay of at least one sample-and-hold block can be set to value bigger than one sampling clock period.

The proposed solution indeed allows for having a different time delay (to start the sampling) and sampling phase in each branch. In this way samples can be collected having a different resolution for use in virtually any application where a signal is sampled over time.

In an advantageous embodiment the clock and timing circuit is also arranged for adapting a sampling frequency applied in the sample-and-hold block of a sample-and-hold branch of the plurality of sample-and-hold blocks.

In an embodiment the sample-and-hold circuit comprises a digital processing block arranged for performing an averaging of samples output by the sample-and-hold blocks.

In one embodiment the clock and timing circuit is arranged for setting a number of iterations to be performed using said time delay and said sampling phase.

In another embodiment the clock and timing circuit is arranged for setting a number of input signals applied to said sample-and-hold circuit.

In a preferred embodiment the sample-and-hold circuit comprising a switching block for controlling read and write operations of the sample-and-hold cells.

In an embodiment each sample-and-hold cell comprises a write-in switch, a read-out switch and a storage element.

In another aspect the invention relates to a light detection and ranging system comprising a photodiode, an amplifier and a sample-and-hold circuit as previously described.

In an embodiment light detection and ranging system comprises a digital processing block arranged for performing an averaging of samples output by the sample-and-hold blocks.

In another aspect the invention relates to a method for collecting sampled data with different time resolutions using a sample-and-hold array comprising a plurality of sample-and-hold blocks arranged in parallel and each comprising one or more sample-and-hold cells, said sample-and-hold array further comprising a clock and timing circuit arranged for setting an adaptable time delay to enable sampling and sampling phase for each sample-and-hold block, the method comprising:
  receiving a first voltage signal,
  sampling and storing said first voltage signal in a first sample-and-hold block of said plurality using a first time delay value and a first phase value set by said clock and timing circuit and in a second sample-and-hold block of said plurality using a second time delay value and a second phase value set by said clock and timing circuit, yielding a first set of stored samples,
  receiving a second voltage signal,
  sampling and storing said second voltage signal in said first sample-and-hold block of said plurality using a third time delay value and a third phase value set by said clock and timing circuit and in said second sample-and-hold block of said plurality using a fourth time delay value and a fourth phase value set by said clock and timing circuit, yielding a second set of stored samples, whereby said third and said fourth time delay value are bigger than one sampling clock period,
  collecting said first and said second set of stored samples obtained in the previous steps, and dividing said stored samples into portions of different resolution, depending on said time delay values and phase values.

In one embodiment the first and second time delay values are equal in said step of sampling and storing said first voltage signal.

In one embodiment the third and fourth time delay values are different in said step of sampling and storing the second voltage signal.

Advantageously, the method comprises an averaging of the sampled data, wherein said receiving, sampling and storing of said first and second voltage signal are repeated a number of times.

In an embodiment the method comprises determining a distance of an object from the collected sampled data.

In yet another aspect the invention relates to a method for collecting sampled data with different time resolutions using a sample-and-hold array comprising a plurality of sample-and-hold blocks arranged in parallel and each comprising one or more sample-and-hold cells, said sample-and-hold array further comprising a clock and timing circuit arranged for setting an adaptable time delay to enable sampling, sampling phase and sampling frequency for each sample-and-hold block, the method comprising:
  receiving a first voltage signal,
  sampling and storing said first voltage signal in a first sample-and-hold block of said plurality using, a first sampling frequency value, a first time delay value and a first phase value set by said clock and timing circuit and in a second sample-and-hold block of said plurality using a second sampling frequency, a second time delay value and a second phase value set by said clock and timing circuit, yielding a first set of stored samples,
  collecting said first set of obtained stored samples, whereby said stored samples can be divided into portions of different time resolution, depending on said sampling frequency values, said time delay values and sampling phase values.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
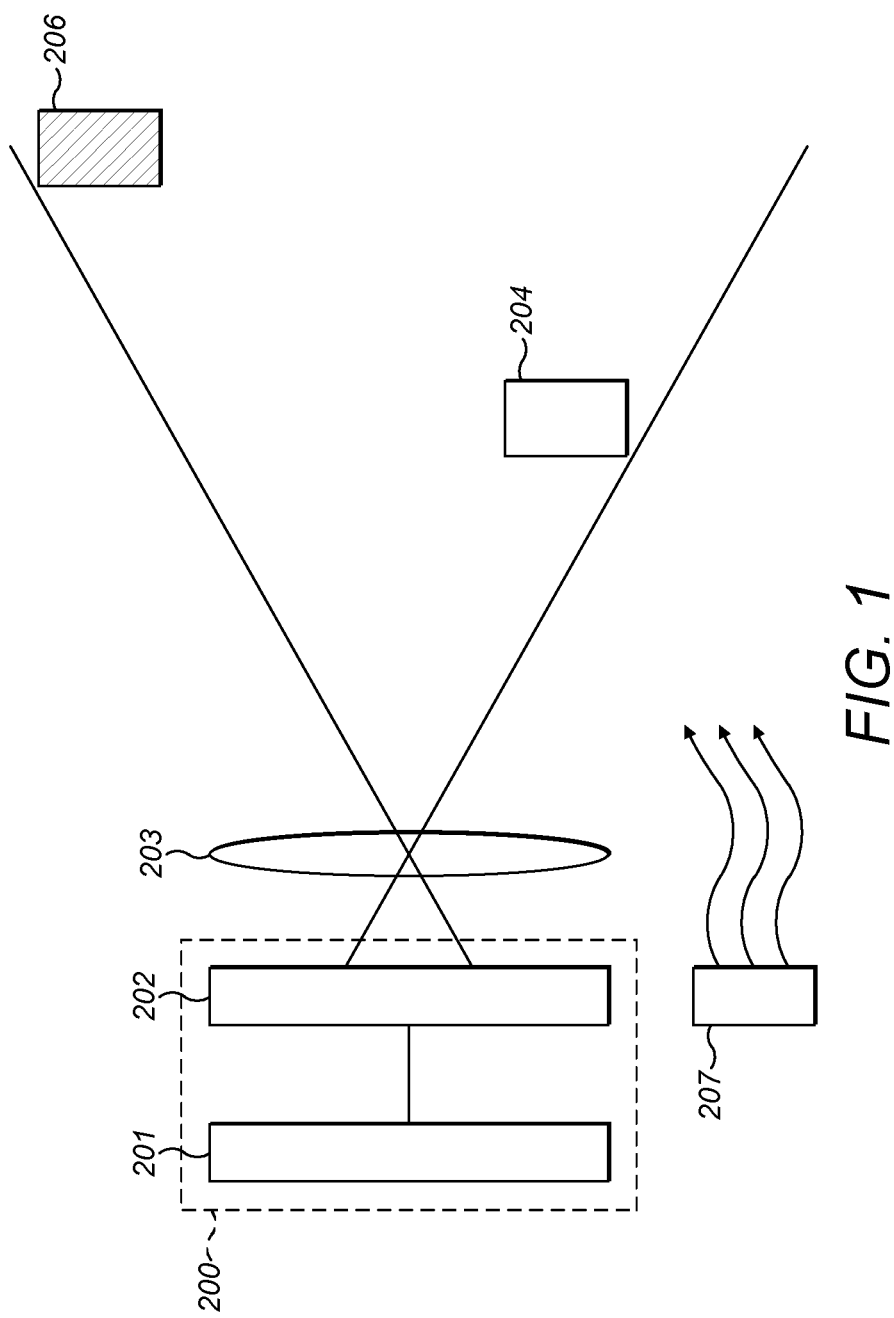
FIG. 1 illustrates a typical LIDAR system composition.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

To overcome the above-mentioned limitations encountered in the prior art the present invention proposes a sample-and-hold circuit offering various options to configure a number of parameters.

Figure 2:
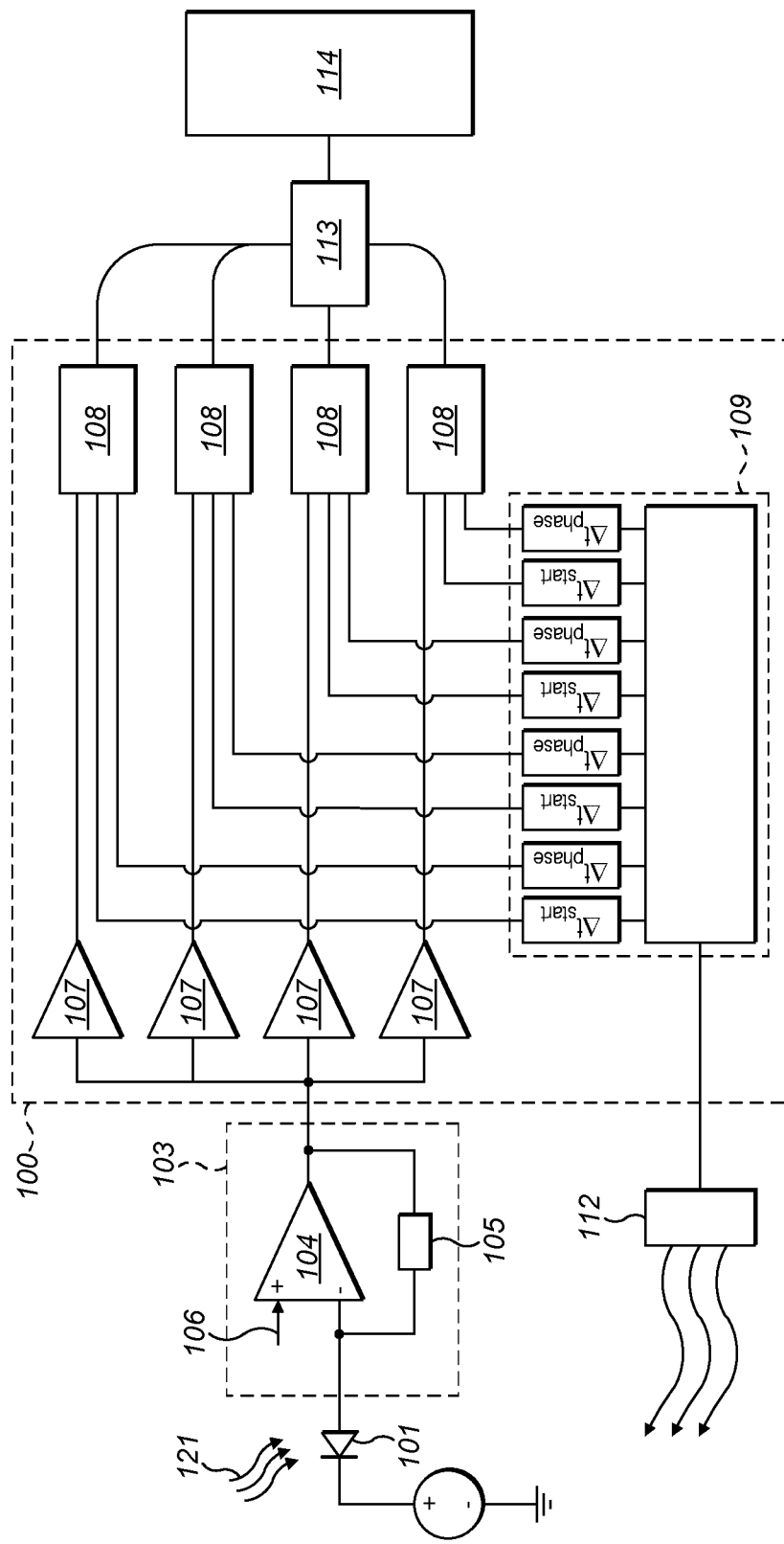
FIG. 2 illustrates an embodiment of the sample-and-hold circuit according to the invention, applied in a LIDAR system.

A block diagram of an embodiment of the proposed sample-and-hold circuit (100) is provided in FIG. 2. In the particular and non-limiting case of FIG. 2 the sample-and-hold circuit of this invention is applied in a LIDAR system. A clock and timing circuit (109) generates a trigger signal that launches a light pulse from the light source (112). The light pulse is reflected by objects and the reflected light pulse (121) is detected by a photodiode (101). The photodiode and an amplifier (103), typically a transimpedance amplifier with feedback resistor (105), convert the reflected pulses of light into a transient voltage signal, which is fed to the sample-and-hold circuit (100) of the present invention. This is done via the negative terminal of the operational amplifier 104, which in the embodiment shown in FIG. 2 receives at its positive terminal a constant voltage (106) as reference signal. Alternatively this positive terminal may be attached to ground. The buffers (107) in the circuit duplicate this analogue voltage signal and drive a number of different sample-and-hold (S/H) blocks (108). The minimum number of S/H blocks is two, but in the non-limiting example illustrated in FIG. 2 four blocks are used.

Figure 3:
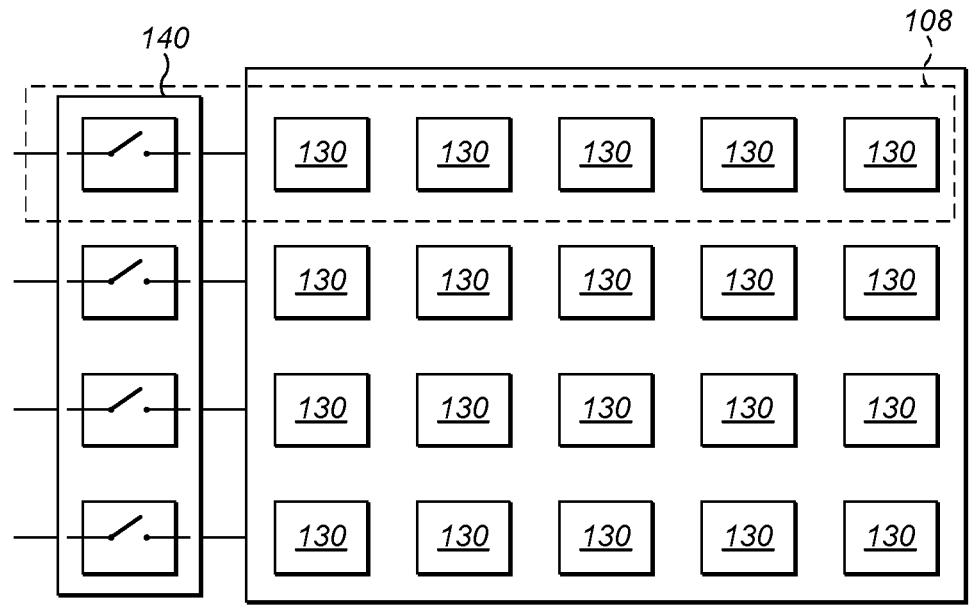
FIG. 3 illustrates a possible implementation of a single sample-and-hold block.

FIG. 3 shows embodiments of the sample-and-hold array containing a plurality of S/H-blocks (108). Each S/H-block (108) comprises one or more sample-and-hold cells (130). The write-in and read out operations are controlled by a switching block (140), which enables controlling to which individual cell the operations are directed. Different ways to implement the switching block (140) with different types of switch configurations are known to the person skilled in the art. The cells can for example be connected to the input via a single wire connecting the each element's input node 134 together. Another option is to build this structure as a multiplexer. An analog-to-digital converter, ADC, (113) can be connected to the array through the switching block (140). During readout the ADC output is sent to a digital processing block (114).

Figure 4:
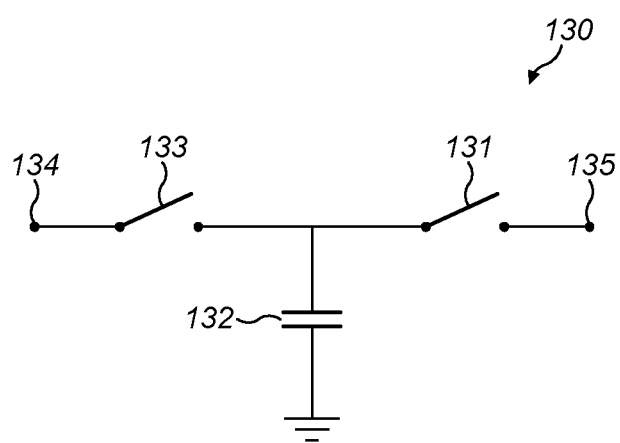
FIG. 4 illustrates a possible implementation of a sample-and-hold cell.

FIG. 4 illustrates the functionality of an individual S/H cell (130). The S/H cell (130) may comprise a write-in switch (133) and read-out switch (131) and a storage element (132), which is represented in FIG. 4 as a capacitor. In principle the switch (133) is closed when a value at the input (134) of the S/H-block is sampled to the storage element (132). When the value in the storage element (132) is read out to the block output (135), the switch (131) is closed while switch (133) is open.

The core component of the sample-and-hold circuit of the invention is the clock and timing circuit (109). This circuit is arranged to generate the timing signals to individual S/H cells (130) of the blocks (108). The timing signals determine the times at which the sample-and-hold blocks sample the received voltage signal. A user can configure the clock and timing circuit by setting at least two parameters to determine the sampling instants. A first parameter $T_{start}$ sets a delay to enable the sampling operation, the delay being relative to a time T0 when a light pulse is launched. A second parameter $T_{phase}$ sets the actual sampling phase. By appropriately setting these parameters sample data with different resolution can be obtained from the at least two parallel sample-and-hold blocks. The information so obtained can next be used for example in a distance determination where in a near field a higher accuracy measurement is achieved than in a farther away field.

As an example illustrating how the timing signals for write-in can be configured, consider a voltage signal being sampled simultaneously with each S/H block (108) having a slightly different phase clock, so that a very high sample rate is achieved for a relatively short period of time. In a second run the timing signals are configured to sample the voltage signal sequentially using the same phase clock so that a relatively long time period can be sampled with a low sample rate. These two sets of sampled data can then be combined to create a single data set that covers a large period of time with a high sampling rate in the portions that require a high sampling rate. This overall data set is in this example thus collected with only two sample runs. A sample run describes a set of acquisitions repeated with the same configuration.

In the example above, in the first sampling run e.g. 100 acquisitions of the reflected signal are obtained with all S/H blocks sampling simultaneously with only a difference in phase clock and in the second sampling run 100 acquisitions for the reflected signal are obtained with all S/H blocks sampling sequentially. In a typical embodiment the digital processing block 114 then applies e.g. an averaging on several samples of the same data to reduce noise. As the same configuration is used to perform a single sample run, the required averaging can readily be carried out.

The configuration capabilities of the clock and timing circuit are elaborated in the further description below using more examples.

As already mentioned, in a minimum set-up the system comprises only two parallel branches each containing a buffer (107) and a sample-and-hold block (108). Such a sample-and-hold circuit with two branches is now considered. The sample-and-hold system of the present invention is so implemented that the user can configure the system to ignore unneeded data points and improve the frame rate. The clock and timing circuit is arranged to pass a user set delay and phase to the first sample-and-hold block and a possibly different delay and phase to the second sample-and-hold block for each applied signal (i.e. for each sample run). In this way it becomes possible to have a sampled data set wherein a certain data portion has another resolution than another data portion.

The sample-and-hold circuit with two parallel branches can be configured to operate as follows:
1. After the transmitted signal is launched at time $T_{L1}$, the amplitude of the received signal is sampled and stored simultaneously in the two sample-and-hold blocks as follows:
    a. SH0 sample times=$T_{L1}$+m*SP; where m=0, 1, 2 ... $M_{part}$, $M_{part}$=$N_{full}$/2
    b. SH1 sample times=$T_{L1}$+1*SP/2+m*SP=$T_{L1}$+(2m+1)*SP/2
    c. Applying the signals stored in the cells (130) to an A/D converter (113)
2. After the second transmitted signal is launched at time $T_{L2}$, the received signal amplitude is sampled and stored simultaneously in the two sample-and-hold blocks as follows. Note that $T_{L2}$ is not necessarily equal to $T_{L1}$+SP*$M_{part}$. There can indeed be some additional delay.
    a. SH0 sample times=$T_{L2}$+1*del+m*SP, where m=0, 1, 2 ... $M_{part}$ and del=SP*$M_{part}$
    b. SH1 sample times=$T_{L2}$+2*del+m*SP
    c. Applying the signals stored in the cells (130) to an A/D converter (113)

The samples obtained in the first sample run have the highest resolution (=SP/2). This is achieved by exploiting the presence of the parallel branches in the circuit. The samples obtained in the second run have half the resolution (=SP). Hence, one obtains two ranges wherein the resolution in the second range is halved as compared to the first range.

As already mentioned previously, in a preferred embodiment an averaging step is performed, wherein the two above-mentioned steps are repeated a number of times.

Another example is considered now. A typical LIDAR application may need very good distance resolution for objects close to the detector, but less resolution for objects at mid and far distances from the detector. The detector considered in this example now has four S/H-blocks (108) with a total number of sample-and-hold cells (130) equal to $N_{full}$. Each S/H-block comprises $M_{part}$ cells. The sample-and-hold circuit can be configured to collect data as follows:
1. After a first light pulse is launched at time $T_{L1}$, the amplitude of the reflected signal is sampled and stored simultaneously in the four sample-and-hold blocks as follows:
    a. SH0 sample times=$T_{L1}$+m*SP; where m=0, 1, 2 ... $M_{part}$, $M_{part}$=$N_{full}$/4
    b. SH1 sample times=$T_{L1}$+1*SP/4+m*SP=$T_{L1}$+(4m+1)*SP/4
    c. SH2 sample times=$T_{L1}$+2*SP/4+m*SP=$T_{L1}$+(4m+2)*SP/4
    d. SH3 sample times=$T_{L1}$+3*SP/4+m*SP=$T_{L1}$+(4m+3)*SP/4
    e. Read-out of all the cells (130) to A/D-converter (113)
2. After a second light pulse is launched at time $T_{L2}$=$T_{L1}$+SP*$M_{part}$, the reflected signal amplitude is sampled and stored simultaneously in the four sample-and-hold blocks as follows:
    a. SH0 sample times=$T_{L2}$+1*del+m*SP, where m=0, 1, 2 ... $M_{part}$ and del=SP*$M_{part}$
    b. SH1 sample times=$T_{L2}$+1*del+SP/2+m*SP
    c. SH2 sample times=$T_{L2}$+2*del+m*SP
    d. SH3 sample times=$T_{L2}$+3*del+m*SP
    e. Read-out to A/D-converter (113)
3. Steps 1 and 2 may be each repeated a number of times to allow signal averaging.
4. The data collected can now be combined to create a data set equivalent to a signal sampled at times:
    a. near field range (0 to 1*del): $T_0$+m*SP/4; m=0, 1, 2, ..., 4*$M_{part}$
    b. mid field range (1*del to 2*del): $T_0$+m*SP/2; m=0, 1, 2, ..., 2*$M_{part}$
    c. far field range (2*del to 4*del): $T_0$+m*SP; m=0, 1, 2, ..., 2*$M_{part}$
    where T0 denotes a reference point in time used to combine the data from the different runs. More generally, it is a point in time equivalent to the time the pulse is launched, possibly with a fixed offset taken into account. In this example T0 is equal to $T_{L1}$.

In this example full resolution is provided for the near field range, half resolution for the mid field range and ¼ resolution for the far field range. This is adequate for most applications since full resolution is not required when the object is far away. Moreover, since less data is collected, the frame rate is twice as fast, i.e. only two sample runs are required instead of four as would be required in a conventional scheme. In this implementation sample-and-hold block i of the plurality of sample-and-hold blocks 108 samples at a time defined by:

$$\text{SHi sample time} = T_L + \Delta t_{start,i} + \Delta t_{phase,i} + m \cdot SP$$

where $\Delta t_{phase,i}$ is defined as $J \cdot SP/K$, with J and K both constants and $\Delta t_{start,i}$ denotes the delay applied to the sample-and-hold block with index i. Hence, appropriately setting the parameters $\Delta t_{start,i}$ and $\Delta t_{phase,i}$ in the clock and timing circuit (109) is sufficient to achieve this.

Figure 5:
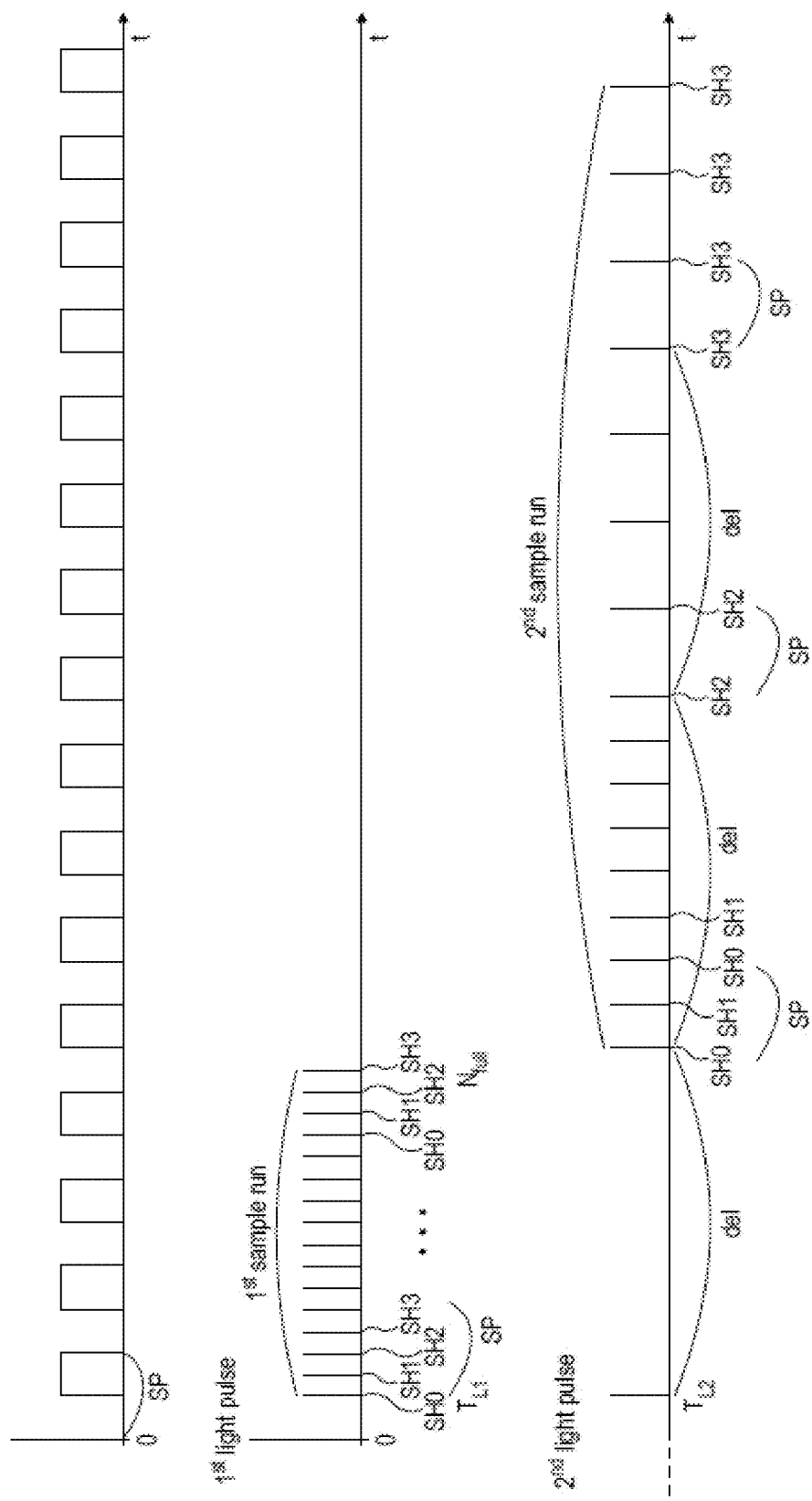
FIG. 5 illustrates a timeline with the sampling instants for the various branches.

FIG. 5 shows the previous example with the number of $N_{full}=16$. The top timeline shows the sampling period SP. The figure in the middle shows the sampling instants of the first sample run. In this sample run the first sampling occurs at $t=T_{L1}$ and that sample is read to SH0-block etc. The figure at the bottom of FIG. 5 depicts the second sample run and also to which sampling blocks the samples are read into.

The embodiments proposed so far allow the user to define the parameters $\Delta t_{start,i}$ and $\Delta t_{phase,i}$ for each sample-and-hold block (108) during each sample run. This allows configuring the system for as much, or as little, resolution as desired for each distance range. For example, the user can configure the system for maximum frame rate by selecting minimum resolution at every distance. When an object is detected, the system can be configured for maximum resolution at the object distance and minimum resolution everywhere else to preserve the frame rate.

Additionally, the solution of the invention allows optimizing for each distance the number of samples acquired for averaging. For example, since objects close to the detector have a larger amplitude reflection, fewer samples need to be acquired to achieve an adequate SNR. So the samples collected in step 1 above can be set to accumulate 50 samples instead of 100 to further improve the frame rate. This does not affect the number of samples collected at mid and far ranges. Note that this is in contrast to traditional implementations, where the data for near, mid and far ranges is collected in the same acquisition, so that it is not possible to have a different number of samples for each range. In fact, the number of samples in step 2 can be increased to 150 to further improve the sensitivity at long ranges. The already mentioned FIG. 1 illustrates a typical situation where there are objects at different distances from the detecting system (200).

Apart from the parameters $\Delta t_{start}$ and $\Delta t_{phase}$ used for each sample-and-hold block (108) after each light pulse, the configuration can further be defined by indicating the number L of light pulses used and the number of times A(x) that the data collection process is repeated for each light pulse:

$\Delta t_{start}(1,1)$=start time for the 1$^{st}$ block 108, after a first light pulse $\Delta t_{phase}(1,1)$=defines the clock phase used for the 1$^{st}$ block 108 after the first light pulse $\Delta t_{start}(2,1)$=start time for the 2$^{nd}$ block 108, after the 1$^{st}$ light pulse $\Delta t_{phase}(2,1)$=defines the clock phase used for the 2$^{nd}$ block 108 after the first light pulse $\Delta t_{start}(3,1)$=start time for the 3$^{rd}$ block 108, after the 1$^{st}$ light pulse $\Delta t_{phase}(3,1)$=defines the clock phase used for the 3$^{rd}$ block 108 after the first light pulse $\Delta t_{start}(4,1)$=start time for the 4$^{th}$ block 108, after the 1$^{st}$ light pulse $\Delta t_{phase}(4,1)$=defines the clock phase used for the 4$^{th}$ block 108 after the first light pulse $\Delta t_{start}(1,2)$=start time for the 1$^{st}$ block 108, after a 2$^{nd}$ light pulse $\Delta t_{phase}(1,2)$=defines the clock phase used for the 1$^{st}$ block 108 after the second light pulse $\Delta t_{start}(2,2)$=start time for the 2$^{nd}$ block 108, after the 2$^{nd}$ light pulse $\Delta t_{phase}(2,2)$=defines the clock phase used for the 2$^{nd}$ block 108 after the 2$^{nd}$ light pulse . . . and so on for each light pulse used.

By adjusting these parameters the user can change the effective sample rate for any time period after the light pulse. For example, if the user wants to have very high resolution for objects near the sensor, the system can be configured as described above in FIG. 5. This configuration provides maximum resolution for the time period corresponding to near objects and less resolution for objects further away to optimize the frame rate.

As another example, if the user knows there is an object of interest at a distance corresponding to a time-of-flight $T_{obj}$, the sample-and-hold circuit can be configured as follows to provide a high resolution scan of the object of interest with a very high frame rate:

L=1, i.e. single light pulse $\Delta t_{start}(1,1) = \Delta t_{start}(1,2) = \Delta t_{start}(1,3) = \Delta t_{start}(1,4) = T_{obj}$ $\Delta t_{phase}(1,1)=0$, $\Delta t_{phase}(1,2)=SP/4$, $\Delta t_{phase}(1,3)=2 \cdot SP/4$, $\Delta t_{phase}(1,4)=3 \cdot SP/4$

A(1)=100

A further example can be the following. The user can configure the system to provide a large amount of averaging for objects far from the sensor to reduce noise. A small amount of averaging can be used for objects near the sensor where the return signals are stronger to optimize the frame rate:

L=4, four light pulses $\Delta t_{start}(1,1)=0$, $\Delta t_{start}(1,2)=10$, $\Delta t_{start}(1,3)=20$, $\Delta t_{start}(1,4)=30$ $\Delta t_{phase}(1,1)=\Delta t_{phase}(1,2)=\Delta t_{phase}(1,3)=\Delta t_{phase}(1,4)=0$

A(1)=20, A(2)=40, A(3)=80, A(4)=200

It should be clear many other configurations are possible.

The configuration is defined by the parameters $\Delta t_{start}$, $\Delta t_{phase}$ used for each S/H block during each light pulse. Additionally the number of times can be defined that this process is repeated for each light pulse to model the averaging used for each section. This can be made configurable by the user during operation. It allows the user to optimize the system for different scenes.

In another embodiment of the sample-and-hold circuit, again applied to a LIDAR system, one of the channels (e.g. the input TIA or one of the buffers (107)) is configured as an integrator for pulse location. An Integrator based analogue front end (AFE) can potentially have a higher effective transimpedance. The noise of the integrator capacitor is seen as just a constant offset (ktC) and thus does not degrade the temporal noise performance.

A short optical pulse received at the input appears as a voltage step on the integrator output. This output step can be detected with a low resolution sample of the integrator output. Thus an integrator based analog front end provides means for detecting a short pulse, even if it falls in between the sampling moments. The sampling rate requirements can thus be relaxed. Once the location of the pulse is roughly identified, a high sample rate but short memory sampler is "locally" sampling the trace to allow a precise peak location.

One problem with the integrating amplifier is large signals can saturate the amplifier output and prevent other signals from being detected. In another embodiment the integrator can be made with a small amount of linear feedback that returns the output to 0 over time. This configuration helps prevent large signals from saturating the amplifier output and improve detection of signals in the presence of large near field signals.

A further example can be the following. The user can configure the system to provide a high frame rate with medium resolution for objects near the sensor and low resolution for objects at mid and far range from the sensor:

L=1, single light pulse $\Delta t_{start}(1,1)=0$, $\Delta t_{start}(2,1)=0$, $\Delta t_{start}(3,1)=10$, $\Delta t_{start}(4,1)=20$ $\Delta t_{phase}(1,1)=0$, $\Delta t_{phase}(2,1)=SP/2$, $\Delta t_{phase}(3,1)=0$, $\Delta t_{phase}(4,1)=0$

A(1)=50

Figure 6:
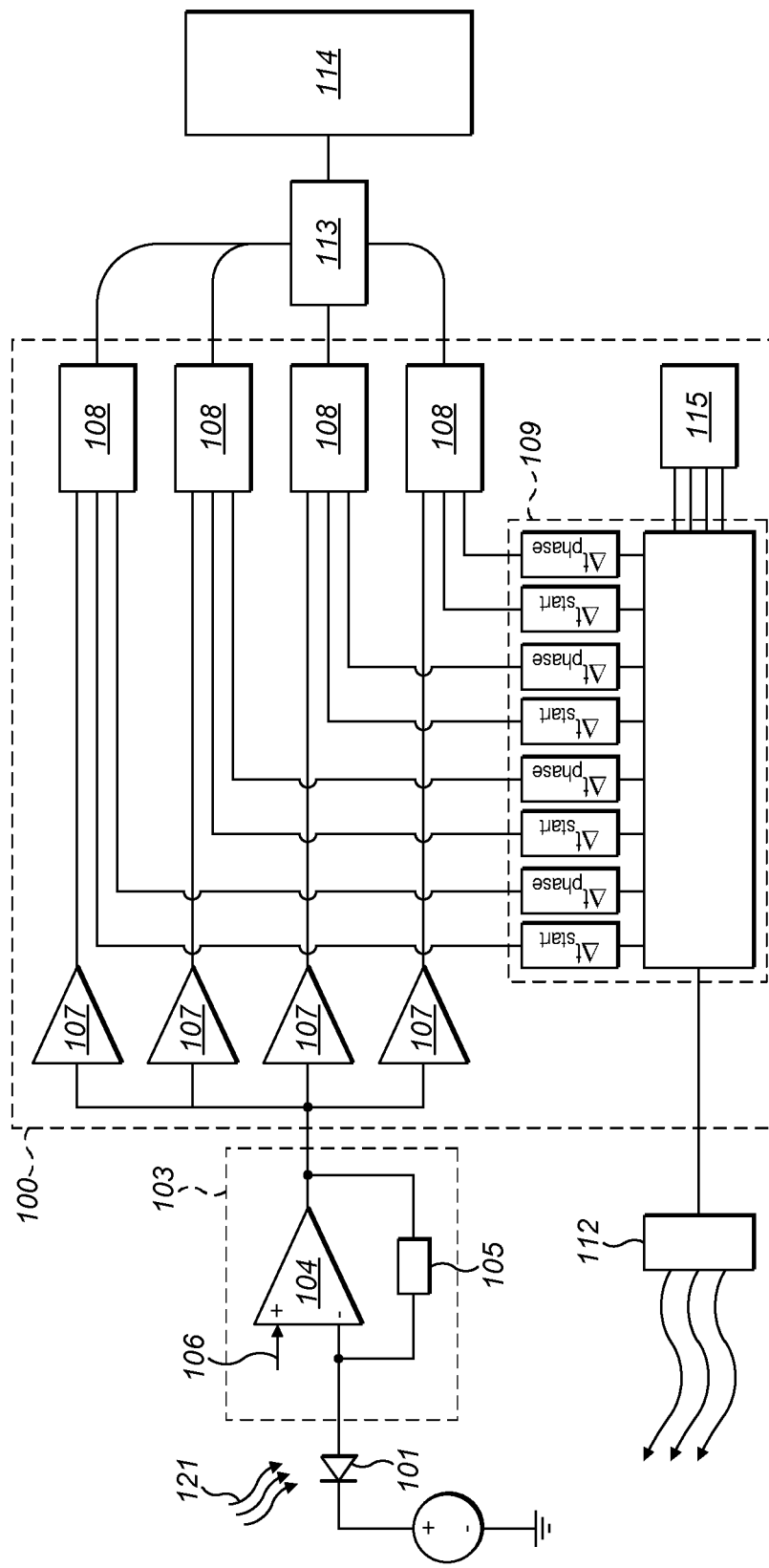
FIG. 6 illustrates an embodiment of the sample-and-hold circuit wherein also the sampling frequency is adaptive.

In a further embodiment the clock and timing generator (109) of the sample-and-hold circuit can not only adapt the time delay $\Delta t_{start}$ and phase $\Delta t_{phase}$ for each sample-and-hold block, but also the sampling frequency. A scheme of such an embodiment of the sample-and-hold circuit is shown in FIG. 6. In this embodiment a multi-frequency clock source 115 provides multiple clock frequencies for use by the timing block 109. Clock source 115 can be implemented as multiple clock sources with variable frequencies, or as a single clock source with multiple frequency dividers used to generate a range of clock frequencies.

Having also the frequency as a parameter opens further options for using the sample-and-hold circuit. As a first example, consider a sample-and-hold circuit with the minimum of two parallel branches ('channel 0' and 'channel 1'). The total number of cells is still $N_{full}$. In channel 0 $M_{part}$ samples are obtained each SP seconds, hence with $f_{samp}=1/SP$, with appropriately set parameters:

$$T_{L1}+m*SP; \text{ where } m=0,1,2 \ldots M_{part}, M_{part}=N_{full}/2$$

Note that the samples cover a time interval of $N_{full} \times SP/2$ seconds.

In channel 1 also $M_{part}$ samples are obtained, but with e.g. 2*SP between two samples, i.e. at half the sampling frequency used:

$$T_{L1}+N_{full} \times SP/2+m*2*SP; \text{ where } m=0,1,2 \ldots M_{part}, M_{part}=N_{full}/2$$

The time interval covered by the samples of channel 1 equals N×SP seconds.

In this example it is required to set for channel 1 $\Delta t_{start}=T_{L1}+N_{full} \times SP/2$ and $\Delta t_{phase}=2SP$. Further, the sampling frequency is set to 1/SP for channel 0 and to 1/(2*SP) for channel 1. The samples of both channels thus cover a total time interval equal to $N_{full} \times SP \times 3/2$.

The samples are next read-out to an A/D-converter (113). This approach then allows (preferably after averaging) distinguishing between a near field range (0 to $N_{full} \times SP/2$) and a mid field range ($N_{full} \times SP/2$ to $N_{full} \times SP \times 3/2$). This example illustrates that with an embodiment of the sample-and-hold circuit wherein the sampling frequency can be regulated, one can even with a single run collect data that lead to results with different resolutions. This example also illustrates that this embodiment can sample the output over a longer time period which gives the system a longer effective range for a given number of sample-and-hold cells.

An exemplary implementation is shown in FIG. 6. A block 115 provides multiple clocks with different frequencies. Each branch can be configured to use one of the clock sources so that different clock frequencies can be selected for each branch. In this configuration the time delay $\Delta t_{phase}$ and $\Delta t_{start}$ used in each branch must be derived from the clock frequency used by that branch. Since $\Delta t_{start}$ of each branch must be an even multiple of the clock period used in that branch, there may be a gap in the data between branches. This can be managed by setting the $\Delta t_{start}$ so that the data sets overlap. This ensures there is no gap in the data collected.

Figure 7:
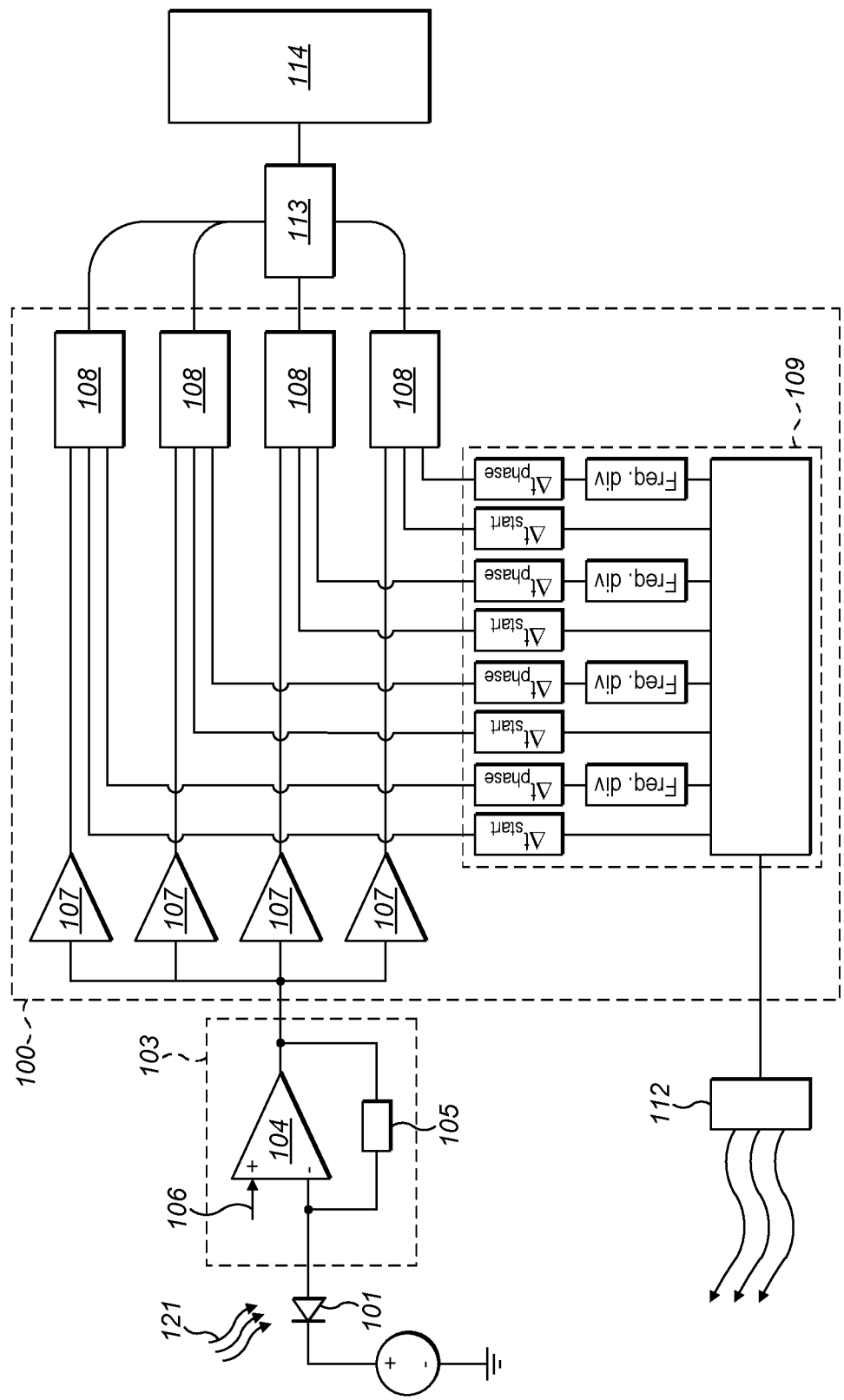
FIG. 7 illustrates another embodiment of the sample-and-hold circuit wherein the sampling frequency is adaptive.

Another implementation example is shown in FIG. 7, where a single source clock is used and frequency dividers change the clock frequency used for each branch.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A sample-and-hold circuit comprising:
   a plurality of sample-and-hold branches arranged in parallel and each comprising a buffer and a sample-and-hold block comprising one or more sample-and-hold cells; and
   a clock and timing circuit that sets, for each of said sample-and-hold blocks, an adaptable time delay which is applied to the sample-and-hold block before the sampling operation is enabled and that sets, for each of said sample-and-hold blocks, an adaptable sampling phase that indicates when within a sampling clock period the sampling actually occurs,
   wherein the time delay of at least one of said sample-and-hold blocks is set to a value bigger than the sampling clock period of the sampling operation.

2. The sample-and-hold circuit as in claim 1, wherein said clock and timing circuit adapts a sampling frequency applied in said sample-and-hold block of a sample-and-hold branch of said plurality.

3. The sample-and-hold circuit as in claim 1, wherein said clock and timing circuit sets a number of iterations to be performed using said time delay and said sampling phase.

4. The sample-and-hold circuit as in claim 1, wherein said clock and timing circuit sets a number of input signals applied to said sample-and-hold circuit.

5. The sample-and-hold circuit as in claim 1, comprising a switching block for controlling read and write operations of said sample-and-hold cells.

6. The sample-and-hold circuit as in claim 1, wherein each sample-and-hold cell comprises a write-in switch, a read-out switch and a storage element.

7. A light detection and ranging system comprising a photodiode, an amplifier and a sample-and-hold circuit as in claim 1.

8. The light detection and ranging system as in claim 7, comprising a digital processing block that performs an averaging of samples output by said sample-and-hold blocks.

9. A method for collecting sampled data with different time resolutions using a sample-and-hold array comprising a plurality of sample-and-hold blocks arranged in parallel and each comprising one or more sample-and-hold cells, said sample-and-hold array further comprising a clock and timing circuit that sets, for each of said sample-and-hold blocks, an adaptable time delay which is applied to the sample-and-hold block before the sampling operation is enabled and that sets an adaptable sampling phase that indicates when within a sampling clock period the sampling actually occurs, the method comprising:

receiving a first voltage signal;

sampling and storing said first voltage signal in a first sample-and-hold block of said plurality using a first time delay value and a first phase value set by said clock and timing circuit and in a second sample-and-hold block of said plurality using a second time delay value and a second phase value set by said clock and timing circuit, yielding a first set of stored samples;

receiving a second voltage signal;

sampling and storing said second voltage signal in said first sample-and-hold block of said plurality using a third time delay value and a third phase value set by said clock and timing circuit and in said second sample-and-hold block of said plurality using a fourth time delay value and a fourth phase value set by said clock and timing circuit, yielding a second set of stored samples, wherein said third and said fourth time delay value are bigger than the sampling clock period;

collecting said first and said second set of stored samples obtained in the previous steps; and dividing said stored samples into portions of different resolution, depending on said time delay values and phase values.

10. The method for collecting sampled data as in claim 9, wherein in said step of sampling and storing said first voltage signal said first and second time delay values are equal.

11. The method for collecting sampled data as in claim 9, wherein in said step of sampling and storing said second voltage signal said third and fourth time delay values are different.

12. The method for collecting sampled data as in claim 9, comprising an averaging of said sampled data, wherein said receiving, sampling and storing of said first and second voltage signal are repeated a number of times.

13. The method for collecting sampled data as in claim 9, comprising determining a distance of an object from the collected sampled data.

14. A method for collecting sampled data with different time resolutions using a sample-and-hold array comprising a plurality of sample-and-hold blocks arranged in parallel and each comprising one or more sample-and-hold cells, said sample-and-hold array further comprising a clock and timing circuit that sets, for each of said sample-and-hold blocks, an adaptable time delay which is applied to the sample-and-hold block before the sampling operation is enabled and that sets an adaptable sampling phase that indicates when within a sampling clock period the sampling actually occurs, the method comprising:

receiving a first voltage signal;

sampling and storing said first voltage signal in a first sample-and-hold block of said plurality using a first sampling frequency value, a first time delay value and a first phase value set by said clock and timing circuit and in a second sample-and-hold block of said plurality using a second sampling frequency, a second time delay value and a second phase value set by said clock and timing circuit, yielding a first set of stored samples; and collecting said first set of obtained stored samples, wherein said stored samples are divided into portions of different time resolution, depending on said sampling frequency values, said time delay values and said sampling phase values.

* * * * *